(12) United States Patent
Murai et al.

(10) Patent No.: US 6,803,584 B2
(45) Date of Patent: Oct. 12, 2004

(54) ELECTRON BEAM CONTROL DEVICE

(75) Inventors: Shiaki Murai, Tokyo-to (JP); Kazuaki Yamamoto, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 10/366,746

(22) Filed: Feb. 14, 2003

(65) Prior Publication Data

US 2003/0234367 A1 Dec. 25, 2003

(30) Foreign Application Priority Data

Feb. 15, 2002 (JP) ......................................... 2002-037674

(51) Int. Cl.[7] .................................................. H01J 37/00
(52) U.S. Cl. ............... 250/398; 250/492.2; 250/492.22; 250/492.23; 250/492.3; 250/310
(58) Field of Search ............................. 250/396 R, 398, 250/306, 307, 309–311, 328, 492.1, 492.2, 492.22, 492.3

(56) References Cited

U.S. PATENT DOCUMENTS

| | | | | |
|---|---|---|---|---|
| 4,084,095 A | * | 4/1978 | Wolfe | ...................... 250/492.2 |
| 4,198,569 A | * | 4/1980 | Takayama | ................. 250/492.2 |
| 4,701,620 A | * | 10/1987 | Okumura et al. | ........... 250/398 |
| 4,728,797 A | * | 3/1988 | Gotou et al. | .............. 250/492.2 |
| 4,907,287 A | * | 3/1990 | Homma et al. | .............. 382/255 |
| 4,973,849 A | * | 11/1990 | Nakamura et al. | ........ 250/492.2 |
| 5,877,032 A | * | 3/1999 | Guinn et al. | ..................... 438/9 |
| 5,912,462 A | * | 6/1999 | Takami et al. | ............... 250/310 |
| 6,057,677 A | * | 5/2000 | Wakana et al. | ................ 324/96 |
| 6,198,957 B1 | * | 3/2001 | Green | ......................... 600/411 |
| 6,366,798 B2 | * | 4/2002 | Green | ......................... 600/411 |
| 2001/0001807 A1 | * | 5/2001 | Green | ......................... 600/411 |
| 2002/0024284 A1 | * | 2/2002 | Oda et al. | .................... 313/413 |

* cited by examiner

Primary Examiner—John R. Lee
Assistant Examiner—Bernard E. Souw
(74) Attorney, Agent, or Firm—Ladas & Parry LLP

(57) ABSTRACT

An electron beam control device controls an electron beam for use, such as an electron beam exposure device and the like, wherein a track of an electron beam is not adversely Influenced by the amount of magnetic variation occurring influences. The electron beam control device which controls an electron beam for use, such as an electron microscope, an electron beam exposure and the like, wherein a magnetometric sensor for measuring an amount of magnetic variation which influences a track of the electron beam, occurring from surrounding influences, is provided.

2 Claims, 2 Drawing Sheets

ELECTRON BEAM CONTROL DEVICE

BACKGROUND OF THE INVENTION

1. Field of the Invention

The present invention relates to an electron beam control device which controls an electron beam for use, such as an electron microscope, an electron beam exposure device and the like, and in particular to an electron beam control device that overcomes the adverse influence on a track of an electron beam due to the amount of magnetic field variation occurring from surrounding influences.

2. Description of the Related Art

Control of an electron beam such as a microscope and an electron bean exposure device using an electron beam is easily Influenced by the surrounding magnetic field variation particularly in case of an electron beam exposure device for preparation of a photomask, it is known that the influence upon the positional control of an electron beam is a serious problem for increasing the semiconductor device density and the necessary miniaturization of the photomask pattern.

Recently, in an electron beam writing device with a strict positional control it is required to control the amount of magnetic field variation from 0.3 mG to 1 mG or less. There Is a need to give sufficient consideration to the environment where the device is installed.

As an installation room where such device is installed, a so-called shield room is generally provided, and the wall surface for such a shield room is made with a high magnetic field permeability material represented by Permalloy to attenuate the magnetic field variation occurring from the surrounding influence.

The method of attenuating the magnetic field variation occurring from toe surrounding influence by the above-described method, ordinarily, is called "a passive magnetic shield method".

However, to satisfy the recent-year device requirements, it is necessary to increase the number of Permalloy layers or to increase the thickness of each layer in the passive magnetic shield method. This affects the cast to rapidly rise in a cumulative basis and becomes an obstacle to decreasing the installation cost of the device.

Further, in a low-frequency range around 0.1 to 1.0 Hz, it has been confirmed that the shielding performance is degraded, and it is known that efficiently suppressing the magnetic field variation (in this range, especially) becomes difficult due to, for example, the passing-by of an automotive vehicle, etc.

In view of the above-described existing circumstances, a new type of shield room has been developed in recent years (1) to apply a magnetic coil to a figuration (ordinarily the six surfaces of a rectangular parallelepiped configuration) surrounding a space targeted for magnetic shielding, (2) to detect the magnetic field variation occurring from the surrounding influence by an internal or an external magnetometric sensor, and (3) to control the electric current flowing through the electromagnetic coil(s) so as to cancel that magnetic field variation, which actively shields the space.

The above-described method of actively attenuating the magnetic field variation occurring from the surrounding influence is called "an active magnetic shielding method", However, there still is no method with a satisfying performance enough to displace the existing shielding room, and there remains the problem that the magnetic field variation that especially comes from the neighborhood and so forth cannot be coped.

SUMMARY OF THE INVENTION

As described above, there appears to be no conventional method with sufficient performance results to displace the existing shielding room that will effectively shield the magnetic field variation that especially comes from the neighborhood. Therefore, for an electron beam control device which controls an electron beam for use, (such as an electron microscope, an electron beam exposure device and the like), a device which a track of an electron beam is not adversely influenced by the amount of magnetic field variation occurring from surrounding influences.

The present invention has been achieved In order to solve the above and other problems. It is an object of this invention to provide an electron beam control device which controls an electron beam for use (such as an electron microscope, an electron beam exposure device and the like) where a track of an electron beam is not adversely influenced by the amount of magnetic field variation occurring from surrounding influences.

In the electron beam control device of the present invention, it is an electron beam control device which controls an electron beam for use (such as an electron microscope, an electron beam exposure device and the like), where a magnetometric sensor for measuring the amount of magnetic field variation occurring from the surrounding influences, which adversely influences a track of an electron beam is provided.

Furthermore, in the above mentioned electron beam control device, a function for adjusting an electron beam control system according to the measured amount of magnetic field variation occurring from the surrounding influences is provided, where the amount of position fluctuation of an electron beam occurring due to the amount of magnetic field variation is calculated and a position of an electron beam is corrected to a position where the amount of position fluctuation is cancelled.

Still more, In the above mentioned electron beam control device, a function for displaying such fact and/or stopping an electron beam manipulation, when the measured amount of magnetic field variation occurring from the surrounding influences exceeds a predetermined range, is provided.

The electron beam control system here includes the meaning of an electron-optical system portion.

The electron beam control system of the present invention, by having the above-described construction, has enabled to provide an electron beam control device, such as an electron microscope and an electron beam exposure device, where a track of an electron beam is not adversely influenced by the amount of magnetic field variation occurring from surrounding influences.

A magnetometric sensor for measuring the amount of magnetic field variation is provided in the electron beam control device to stop the electron beam manipulation, or to correct the position of the electron beam by adjusting the control system, according to the measured amount of magnetic field variation. Thereby, it enables to control the influence of the magnetic field variation.

By this, it is possible to control the positional variation of the electron beam due to the magnetic field variation and to realize the electron beam position control with a high accuracy.

The present invention, as described above, provides an electron beam control device which controls an electron beam for use, (such as an electron microscope, an electron beam exposure device and the like) where a track of an electron beam is not adversely influenced by the amount of magnetic field variation occurring from surrounding influences.

That is to say, it is possible to realize a high accuracy electron beam control from device that is not influenced of the amount of magnetic field variation occurring from the surrounding influences.

As a result of this, especially in the electron beam exposure device for use for the preparation of a photomask under technological requirements in recent years to increase in the density of the semiconductor device and to miniaturize the pattern of the photomask, effectively shielding the influence of the amount of magnetic field variation occurring from the surrounding influences has been desired for the quality of the product, among others.

DESCRIPTION OF THE PREFERRED EMBODIMENTS

An embodiment of an electron beam control device in the present invention will now be explained with reference to the drawings.

Figure 1:
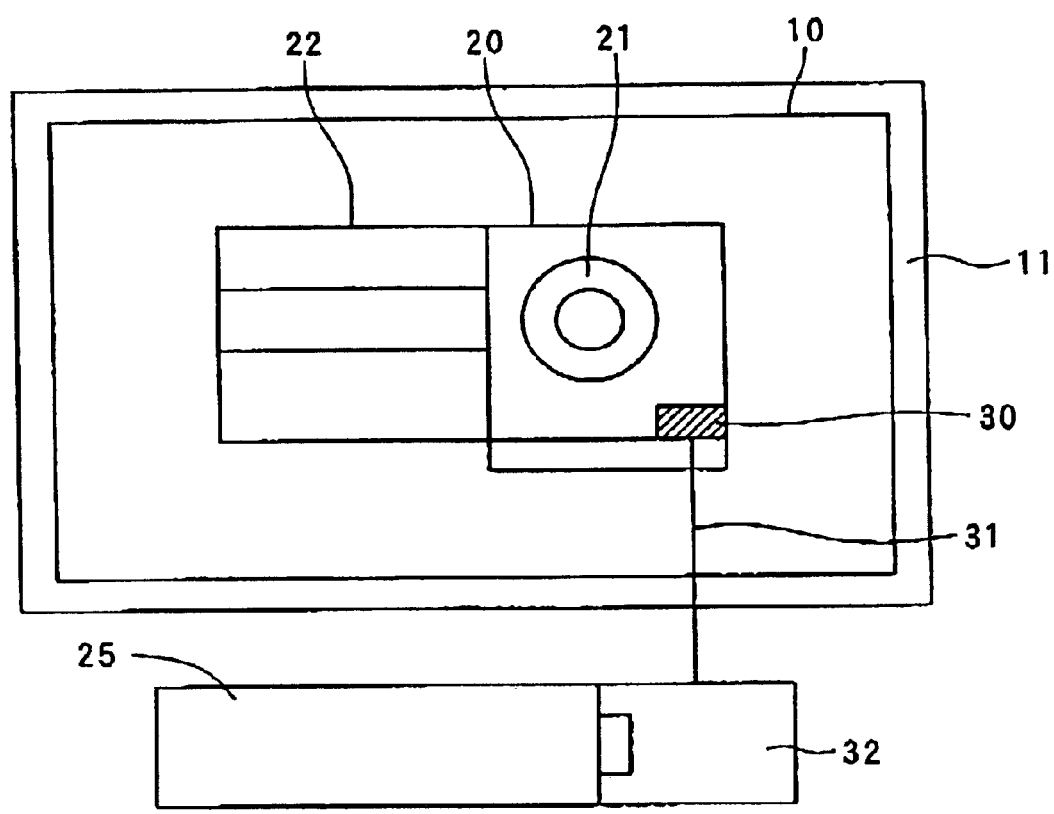
FIG. 1 is a schematic construction diagram, showing an embodiment of an electron beam control device of the present invention.

FIG. 1 is a schematic construction diagram showing an embodiment of the electron beam control device of the present invention.

In FIG. 1, a reference numeral 10 denotes an installation room (of an electron beam exposure device), a reference numeral 11 denotes a wall, a reference numeral 20 denotes an electron beam exposure portion, a reference numeral 21 denotes an electron-optical system portion (also called "a lens-barrel portion"), a reference numeral 22 denotes a bench (also called "a vibration-proof platform"), a reference numeral 25 denotes an electron beam controller, a reference numeral 30 denotes a magnetometric sensor, 8 reference numeral 31 denotes a wiring for the magnetometric sensor, and a reference numeral 32 denotes an amplifier.

The electron beam control device of this embodiment will now be explained with reference to FIG 1.

The electron beam control device of this embodiment is an electron beam exposure device that performs writing exposure for preparing the pattern of a photomask. The magnetometric sensor 30 measures the magnetic field variation occurring from the surrounding that adversely influences a track of an electron beam. The magnetometric sensor 30 is equipped near the electron-optical system portion 21 of the electron beam exposure portion 20. Further, the electron beam control device has a function for stopping the operation of exposure writing of the electron beam, when the measured amount of magnetic field variation from the surrounding influence exceeds a predetermined range.

In the electron beam exposure device of an embodiment of the present invention, an electron beam is controlled to irradiate from the electron-optical system portion 21 onto the surface of the substrate for preparing a photomask (not shown in the figure). The substrate for preparing a photomask, for example, in a state where the substrate for preparing a photomask is set on a stage, is controlled to move in X and Y directions.

The stage (not shown in the figure) and the electron-optical system portion 21 are provided on the bench (the vibration-proof platform) 22.

According to an embodiment of the present invention, the electron beam of the electron-optical system portion 21 is ordinarily controlled according to the instruction issued from the controller 25, and, simultaneously, the position of the stage which moves in the X and Y directions is controlled by a laser interferometer. By doing so, the irradiating position control of the electron beam, on the substrate for preparing a photomask, is performed and exposure writing is performed. On the other hand, the magnetometric sensor 30 monitors the magnetic field variation near it at all times, and thereby sends the status of magnetic field variation to the amplifier 32 via the writing 31 for the magnetometric sensor on a real-time basis.

As the positions of the substrate for preparing a photomask is controlled while the electron beam irradiates on the substrate (by the electron beam control of the electron-optical system portion 21 and by position control of the stage), the controller 25 considers the output of the amplifier 32, and if the output of the amplifier 32 is outside the set range, the controller 25 compulsively cuts off the 3 write enable signal to make the exposure writing operation to being kept in a state of standby. If the output of the amplifier 32 is within the set range, the controller 25 does not cut off the write enable signal, so that the exposure writing operator is kept in a state of being able to execute.

In this way, when the amount of magnetic field variation occurring from the surrounding influences measured by the magnetometer sensor 30 exceeds a prescribed range, it is arranged that the operation of exposure writing of the electron beam is stopped in the electron beam exposure device according to an embodiment of the present invention.

The write enable signal may be understood as being a control signal of the controller that indicates a state which the exposure writing operation can be executed and as a control signal which is used in an ordinary electron beam exposure device.

There are numerous types of sensors for detecting the amounts of magnetic field variation, for example, semiconductor magnetometric sensors, optical fiber, magnetometric sensors, and SQUID (Superconducting Quantum Interference Device) magnetometer (also called "a flux meter") that detect the amount of magnetic field variation, etc., which are used according to the environmental characteristic and use purpose. In this embodiment, a primary-differential type SQUID magnetometer is used although other types of sensors may be used.

One company that makes a wideband magnetometric sensor for detecting the amount of magnetic-field variation, which can detect a magnetic-field fluctuation level of several Hz to 1 KHz or more, is Magban Company.

While a presently preferred embodiment has been described with respect for purposes of this disclosures, the present invention is not limited to the above-described embodiment For example, an electron beam exposure device which has a magnetometric sensor of the above-described embodiment may have a function to adjust an electron beam control system (the electron-optical system portion 21) according to the measured amount of magnetic field variation occurring from the surrounding influences by the magnetometric sensor, and to calculate the amount of positional variation of the electron beam that occurs corresponding to the amount of magnetic field variation to correct the position of the electron beam to the position where the positional variation can be canceled.

In this case, there Is a construction, wherein the amount of deflection of the electron beam is corrected according to the output of the amplifier 32 of the magnetometric sensor 30.

As a result of this, exposure writing can be performed without stopping the electron beam exposure device and without being qualitatively influenced by th 3 amount of the magnetic field variation occurring from the surrounding influences.

EXAMPLES

Examples are shown below, and the present Invention will further be explained.

(Example)

Figure 2:
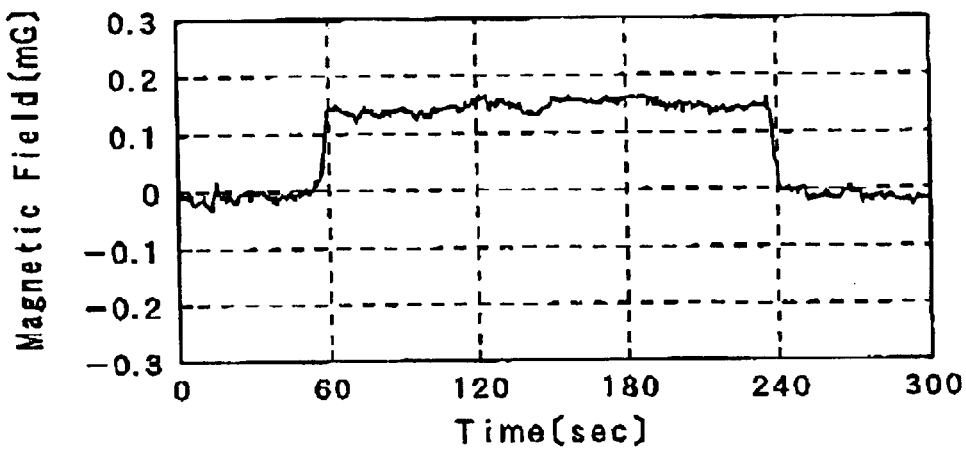
FIG. 2 is a chart showing the amount of magnetic field variation occurring from the surrounding influences to the electron beam.

A magnetic field variation shown in FIG. 2 was externally given to an electron beam, and positional variation of the electron beam, in a case which the electron beam was controlled by the electron beam control device shown In FIG. 1, was measured.

As the magnetic field variation that is externally given, 0.15 mG of variation was applied continuously for 180 seconds, thereafter that application was stopped (FIG. 2).

Figure 4:
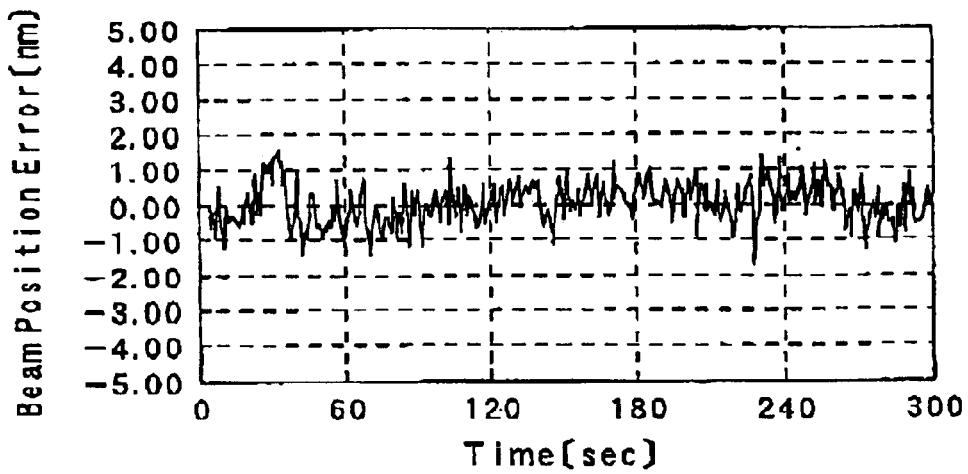
FIG. 4 is a chart showing the positional variation of the electron beam that occurs when the magnetic field variation shown in FIG. 2 is in effect, in the case, which the electron beam control device of the present invention has been used

The measured result is shown in FIG. 4. The positional variation of the electron beam was $3\delta=1.8$ nm.

(Comparative Example)

Except for that the electron beam control device shown in FIG. 1 was not used, the positional variation of the electron beam was measured under the same conditions as those in the Example 1 above.

Figure 3:
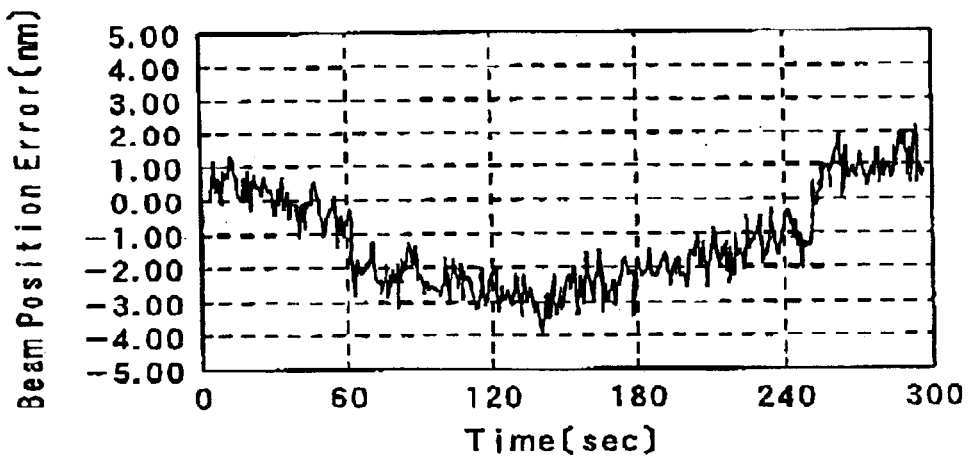
FIG. 3 is a chart showing the amount of positional variation of the electron beam that occurs when the magnetic field variation shown In FIG. 2 has been applied.

As a result of the measurement, the positional variation of the electron team was $3\delta=4.7$ nm with respect to 0.15 mG of magnetic field variation. The measured result is shown in FIG. 3. In FIG. 3. it is obvious that the position of the electron beam is greatly curved in such a way as to be synchronized with the magnetic field variation that has been applied.

From the both results of the Example and the Comparative Example, it is shown that when using the electron beam control device shown In FIG. 1, the amount of positional variation of the electron beam can be greatly improved.

The electron beam control device of the present invention is equipped with a magnetometric sensor so as to suppress the amount of positional variation of the electron beam, monitors the amount of magnetic field variation occurring from surrounding influences at all times, and predicts the electron beam positional variation occurring from the magnetic field variation. That electron beam control device, further, controls the electron beam to the positron at which the positional variation is canceled, thereby eases the influence of the magnetic field variation, and enables controlling the electron beam to a stable position as shown In FIG. 4. By using the electron beam control device of the present invention, electron beam can be controlled without being influenced by the magnetic field variation occurring from the surrounding influences.

What is claimed is:

1. An electron beam control device, which controls an electron beam for use in one or more devices including an electron microscope and an electron beam exposure device, comprising:

a magnetometric sensor for measuring an amount of magnetic field variation, which influences a track of the electron beam and are occurring from surrounding influences, wherein the magnetometric sensor is provided with a function for adjusting an electron beam control system according to the amount of magnetic variation measured by the magnetometric sensor, and wherein the electron beam control device is provided with functions for calculating the amount of positional variation of the electron beam which may occur according to the amount of magnetic field variation, and a position of the electron beam is corrected to a position where the amount of positional variation is cancelled.

2. The electron beam control device according to claim 1, wherein the electron beam control device is provided with functions for displaying information and for stopping an electron beam manipulation, when the measured amount of magnetic filed variation occurring from the surrounding influences exceeds a predetermine range.

* * * * *